United States Patent
Wolff et al.

(10) Patent No.: US 9,590,045 B2
(45) Date of Patent: Mar. 7, 2017

(54) GRAPHENE BASE TRANSISTOR AND METHOD FOR MAKING THE SAME

(71) Applicant: IHP GMBH—INNOVATIONS FOR HIGH PERFORMANCE MICROELECTRONICS/ LEIBNIZ—INSTITUT FÜR INNOVATIVE MIKROELEKTRONIK, Frankfurt (Oder) (DE)

(72) Inventors: Andre Wolff, Frankfurt (DE); Wolfgang Mehr, Friedersdorf (DE); Grzegorz Lupina, Berlin (DE); Jaroslaw Dabrowski, Frankfurt (DE); Gunther Lippert, Frankfurt (DE); Mindaugas Lukosius, Frankfurt (DE); Chafik Meliani, Berlin (DE); Christian Wenger, Berlin (DE)

(73) Assignee: IHP GMBH—INNOVATIONS FOR HIGH PERFORMANCE MICROELECTRONICS/ LEIBNIZ—INSTITUT FUR INNOVATIVE MIKROELEKTRONIK, Frankfurt (DE)

( * ) Notice: Subject to any disclaimer, the term of this patent is extended or adjusted under 35 U.S.C. 154(b) by 0 days.

(21) Appl. No.: 14/894,090

(22) PCT Filed: May 23, 2014

(86) PCT No.: PCT/EP2014/060735
§ 371 (c)(1),
(2) Date: Nov. 25, 2015

(87) PCT Pub. No.: WO2014/191328
PCT Pub. Date: Dec. 4, 2014

(65) Prior Publication Data
US 2016/0104778 A1    Apr. 14, 2016

(30) Foreign Application Priority Data

May 29, 2013    (EP) ..................... 13169804

(51) Int. Cl.
*H01L 29/06*    (2006.01)
*H01L 29/16*    (2006.01)
(Continued)

(52) U.S. Cl.
CPC ........ *H01L 29/1606* (2013.01); *H01L 21/308* (2013.01); *H01L 29/0649* (2013.01);
(Continued)

(58) Field of Classification Search
None
See application file for complete search history.

(56) References Cited

U.S. PATENT DOCUMENTS 7,936,040 B2 * 5/2011 Wu ..................... H01L 27/0605
                                                        257/474
8,179,937 B2 * 5/2012 Walter ................... B82Y 20/00
                                                        372/29.013
(Continued)

FOREIGN PATENT DOCUMENTS

DE    10 2008 055100 A1    7/2010
EP        2 525 409 A1    11/2012

OTHER PUBLICATIONS

Wolfgang Mehr, et al; "Vertical Graphene Base Transistor"; IEEE Electron Device Letters, IEEE Service Center, New York, NY; vol. 33, No. 5; May 1, 2012; pp. 691-693.
(Continued)

*Primary Examiner* — David E Graybill
(74) *Attorney, Agent, or Firm* — Ware, Fressola, Maguire & Barber LLP (57) ABSTRACT

A graphene base transistor comprises on a semiconductor substrate surface an emitter pillar and an emitter-contact
(Continued)

pillar, which extend from a pillar foundation in a vertical direction. A dielectric filling layer laterally embeds the emitter pillar and the emitter-contact pillar above the pillar foundation. The dielectric filling layer has an upper surface that is flush with a top surface of the emitter pillar and with the at least one base-contact arm of a base-contact structure. A graphene base forms a contiguous layer between a top surface of the emitter pillar and a top surface of the base-contact arm. A collector stack and the base have the same lateral extension parallel to the substrate surface and perpendicular to those edges of the top surface of the emitter pillar and the base-contact arm that face each other.

17 Claims, 6 Drawing Sheets (51) Int. Cl.
　　　H01L 29/66　　　(2006.01)
　　　H01L 29/737　　　(2006.01)
　　　H01L 21/308　　　(2006.01)
　　　H01L 29/08　　　(2006.01)
　　　H01L 29/10　　　(2006.01)
　　　H01L 29/417　　　(2006.01)
　　　H01L 29/45　　　(2006.01)
　　　H01L 29/73　　　(2006.01)
(52) U.S. Cl.
　　　CPC ...... *H01L 29/0692* (2013.01); *H01L 29/0804* (2013.01); *H01L 29/0821* (2013.01); *H01L 29/1004* (2013.01); *H01L 29/41708* (2013.01); *H01L 29/45* (2013.01); *H01L 29/66037* (2013.01); *H01L 29/73* (2013.01); *H01L 29/737* (2013.01)

(56) References Cited

U.S. PATENT DOCUMENTS

| | | | |
|---|---|---|---|
| 8,778,782 B2* | 7/2014 | Lippert | B82Y 10/00 257/9 |
| 8,901,536 B2* | 12/2014 | Kub | B82Y 10/00 257/15 |
| 2010/0102298 A1* | 4/2010 | Wu | H01L 27/0605 257/25 |
| 2010/0272140 A1* | 10/2010 | Walter | B82Y 20/00 372/38.02 |
| 2011/0175060 A1* | 7/2011 | Okai | B82Y 40/00 257/29 |
| 2012/0068157 A1 | 3/2012 | Kub | |
| 2012/0132885 A1* | 5/2012 | Lippert | B82Y 10/00 257/9 |

OTHER PUBLICATIONS

Aaron D. Franklin, et al; "Double Contacts for Improved Performance of Graphene Transistors"; IEEE Electron Device Letters; vol. 33, No. 1; Jan. 2012; pp. 17-19.

Inanc Meric, et al.; "High-frequency performance of graphene field effect transistors with saturating IV-characteristics"; IEEE; 2011; pp. 2.1.1-2.1.4.

Yanqing Wu, et al; "State-of-the-Art Graphene High-Frequency Electronics"; Nano Letters; ACS Publications; 2012; pp. 3062-3067.

* cited by examiner

GRAPHENE BASE TRANSISTOR AND METHOD FOR MAKING THE SAME

CROSS REFERENCE TO RELATED APPLICATIONS

This application is the U.S. National Stage of International Application Number PCT/EP2014/060735 filed on May 23, 2014 which claims priority under 35 USC §119 to European Patent Application No. 13169804.5 filed on May 29, 2013. Both applications are hereby incorporated by reference in their entirety.

TECHNICAL FIELD

The present invention relates to a graphene base transistor and to a method for making a graphene base transistor. It also relates to an electronic component comprising at least one graphene base transistor and at least one other active or passive electronic device on the same substrate, and to a method for making such an electronic component.

BACKGROUND OF THE INVENTION

Carbon-based materials are considered as having a great potential to improve radio-frequency (RF) and even THz-frequency electronics as well as digital electronics. Graphene is a name given to a single layer of carbon atoms arranged in a honeycomb lattice, although also films built of few graphene sheets stacked one upon another are often referred to as graphene (or few-layer graphene) and shall also be considered as embodiments of a graphene layer herein. Single-layer graphene is a zero band gap semiconductor with outstanding material properties, such as charge carrier mobility of around $1.2 \times 10^5$ cm$^2$/Vs at 240 K, high field electron velocity of $4 \times 10^7$ cm/s, sheet resistance as low as 125 Ω/sq (about 30 Ω/sq for four-layer films), and thickness of only 0.34 nm.

The document EP 2 525 409 discloses a graphene base transistor device having a graphene base for the transport of electrons into a collector. The transistor has a heterostructure comprising an emitter, a collector, and a graphene base layer of one or more sheets of graphene between the emitter and the collector. Graphene base transistors are sometimes also referred to as graphene junction transistors or as graphene hot electron or graphene hot-carrier transistors.

SUMMARY OF THE INVENTION

According to a first aspect of the present invention, a graphene base transistor comprises on a semiconductor substrate surface:
- at least one emitter pillar and at least one emitter-contact pillar, which extend from a pillar foundation, through which they are electrically connected, in a vertical direction pointing away from the substrate surface;
- a dielectric filling layer laterally embedding the emitter pillar and the emitter-contact pillar, and separating them from each other in regions above the pillar foundation, the dielectric filling layer having an upper surface that is flush with a top surface of the emitter pillar,
- an electrically conductive base-contact structure, which is either arranged on or embedded in the dielectric filling layer and which includes
  a) a base-contact face, which is arranged at a lateral distance from the emitter pillar, and,
  b) at least one base-contact arm, which extends from the base-contact face in a direction parallel to the substrate surface and passes between the top surfaces of the emitter pillar and of emitter contact-pillar without directly contacting them;
- a base layer of graphene forming a contiguous layer that extends between and covers an immediately adjacent top surface of the emitter pillar and also covers at least a part of an underlying top surface of the at least one base-contact arm;
- a collector stack that comprises at least a collector-barrier layer, which is arranged immediately on the graphene layer, and an electrically conductive collector layer, which is arranged on the collector-barrier layer, wherein the collector stack and the base layer have the same lateral extension in a direction that is parallel to the substrate surface and perpendicular to those edges of the top surface of the emitter pillar and the base-contact arm that face each other.

The proposed graphene base transistor has a structure that is particularly suited for the integration of a graphene base transistor into known standard processes for fabrication of semiconductor devices. The structure of the graphene base transistor of the present invention ensures that in the fabrication process a suitable substrate for a fabrication of the graphene base layer is provided and that further processing of the exposed graphene layer is limited to steps required for deposition of the collector barrier layer. The graphene base transistor of the present invention in particular avoids a fabrication and structuring of base contacts and emitter contacts after the graphene layer has been fabricated. This way, the extremely sensitive graphene layer is protected from processing steps that bear a risk of damaging the layer.

A first particularly advantageous structural feature of the graphene base transistor of the present invention is that the dielectric filling layer has an upper surface that is flush with a to top surface of the emitter pillar and with a top surface of the at least one base-contact arm. This provides a surface that is well suited for fabrication of the graphene base layer. In one embodiment implementing this feature, the dielectric filling layer, the base-contact arm and the emitter pillar form an exactly plane surface. However, the term "flush" includes further embodiments, wherein minor surface steps exist at edges between the dielectric filling layer, the top surface of the emitter pillar and/or the top surface of the base-contact arm. Such minor surface steps are in the range of a surface roughness level achievable by polishing techniques such as chemical-mechanical planarization (CMP). The minor surface steps of some embodiments range from a step height of one atomic or molecular layer to a step height of not more than 15 nanometer, preferably not more than 10 nanometer, and in some embodiments not more than 5 nanometer, in other embodiments not more than 2 nanometer.

In this regard, a benefit from this first advantageous structural feature is achieved in different alternative options of fabricating the graphene base layer. When using graphene transfer, exfoliation or bonding techniques for graphene deposition in the fabrication process of the transistor, it is particularly helpful to provide a flat surface that does not have differences in height between the top surface of the base-contact arm and the top surface of the emitter pillar. The surface of the dielectric layer is preferably at the same level or a little lower, but not at a higher level than the top surfaces of the base-contact arm and the emitter pillar. This is achieved with the graphene base transistor of the present invention. On the other hand, when using a vapour-phase deposition of graphene, seeding of graphene growth benefits from minor step-like structures, which in the present case can be provided at edges between the top surface of the base-contact arm and of the dielectric filling layer, or the top surface of the dielectric filling layer and of the emitter pillar. Thus, also vapour-phase deposition techniques, such as chemical vapor deposition techniques, benefit from the design of the graphene base transistor of the present invention.

Thus, by depositing the graphene base layer on the surface having the first advantageous structural feature, good and immediate contact between the emitter, graphene base layer and the base-contact arm is established for different alternative techniques of graphene deposition, and no further processing is required to establish that contact, albeit the contact may be further improved by performing additional process steps after collector barrier deposition. This also protects the sensitive graphene layer from damage during this stage of fabrication.

A second particularly advantageous feature of the graphene base transistor of the present invention is formed by an emitter-contact pillar that is laterally separated from the emitter pillar at the level of the graphene base layer and by establishing an electrical contact between the emitter pillar and the emitter-contact pillar through a near-substrate pillar foundation. This structure also avoids that the graphene layer is damaged by fabricating the emitter contact after the graphene deposition. In fact, since the emitter structure including the pillar foundation, the emitter pillar and the emitter-contact pillar is arranged near the substrate, it can be achieved that the emitter contact structure, which is a requirement for any graphene base transistor, is present already at the time the graphene base layer is fabricated.

The structure of the graphene base transistor of the present invention further ensures that the sensitive graphene layer need not at all be processed alone, i.e., without protection by other layers, after its deposition, apart from deposition of the collector barrier layer. Such processing of the graphene layer alone would by very disadvantageous for the production yield, because damage to the graphene layer in processing the graphene layer alone turns out to be very difficult to avoid.

The graphene base transistor of the present invention is thus based on the recognition by the inventors that an economically favourable integration of graphene base transistors into standard industrial silicon-based fabrication processes of semiconductors, such as MOS, BiMOS, NMOS, PMOS, CMOS, or BiCMOS processes (but not excluding transistor fabrication on flexible or transparent substrates), but also into fabrication processes of photonic semiconductor devices, such as lasers, sensors or light-emitting diodes, or passive devices such as capacitors or inductances, or MEMS devices, or into processing technologies including a fabrication of devices made from III-V-semiconductors, is made possible if any damage to the sensitive graphene layer is avoided in any other of the processing steps, which are required after the fabrication of the graphene base layer. However, the inventors at the same time recognized that a deposition of the graphene base layer is not easily limited to exactly the lateral extension desired for the base layer of the graphene base transistor. For instance, using a mask, which could protect regions other than those desired for the graphene base layer from undesired graphene deposition, would in turn require a mask-removal step after the graphene base has been deposited. This mask-removal step would attack the sensitive graphene layer.

The structure of the present invention achieves and reflects that any processing of the graphene base layer after its deposition is done in combination with the collector stack that protects the graphene base layer. In particular, the collector stack deposited over the graphene layer at the same time protects the desired graphene base layer during a required structuring that limits the lateral extension of an originally deposited graphene layer to the desired extension of the base layer. For this reason, in accordance with the present invention, the collector stack and the base layer have a common lateral extension in a direction that is parallel to the substrate surface and perpendicular to those edges of the top surface of the emitter pillar and the base-contact arm that face each other.

In the following, preferred embodiments of the graphene base transistor of the present invention are described.

The transistor design of the present invention is particularly suited for graphene hot-electron transistors, but can also be used for a graphene hot-hole transistor.

The emitter-base junction of the graphene base transistor is in different embodiments formed by either a Schottky diode, or a tunnel diode, or a pn junction. In embodiments that form a tunnel diode, the top surface of the emitter pillar is formed by an emitter-barrier layer that is made of a dielectric material while the rest of the emitter pillar is made of a semiconductor material. For a hot-electron transistor, the emitter pillar is suitably made of a highly-doped n-type semiconductor, such as silicon Si or germanium Ge or a silicon-germanium alloy SiGe.

The emitter-barrier layer is preferably made of a dielectric material that as a dielectric constant and thickness, which in combination allow Fowler-Nordheim tunnelling or direct tunnelling of charge carriers in an on-state of the transistor through the potential barrier formed by the emitter-barrier layer. Tuning the transistor design for achieving a desired threshold voltage for entering the on state may include selecting a dielectric material of the emitter-barrier layer that has a suitable dielectric constant in the desired frequency range to be used during operation, or selecting the thickness of the emitter-barrier layer, or both.

In one embodiment, the pillar foundation is arranged on a foundation mesa that is formed on the substrate surface. This improves an electrical isolation between the transistor and neighboring devices on the substrate.

The transistor is provided in some embodiments with only one emitter-contact pillar. However, preferred embodiments of the graphene base transistor comprise two emitter-contact pillars arranged on opposite lateral sides of the emitter pillar. These embodiments allow achieving a particularly low ohmic resistance of the emitter contact and emitter-contact pillar.

In some embodiments, the emitter pillar has the shape of a rectangular parallelepiped. The rectangle forming the top surface of the parallelepiped is a square in one variant of this embodiment, but other variants use a rectangle with different side lengths, resulting in an emitter pillar that has a fin shape. In an embodiment particularly suited for high-frequency operation, the emitter pillar has the shape of an upright truncated cone. The cone top and base planes preferably have a rectangular shape, even more preferably a square shape. Cone-shaped emitter pillars allow reducing the size/area of the emitter-base junction, which is beneficial for reducing the base-emitter capacitance. The emitter-contact pillar/pillars may have a similar cone shape as the emitter pillar.

Embodiments designed for achieving a high emitter-collector current in operation of the graphene base transistor may use two or more emitter pillars, which are electrically connected through a common pillar foundation. The emitter pillars of these embodiments preferably are arranged along a line that is parallel to the longitudinal direction of the base-contact arm.

In those embodiments that use two emitter-contact pillars, the base-contact structure preferably has two base-contact arms that extend in parallel to each other from the base-contact face on opposite sides of the emitter pillar and that pass between respective edges of the top face of the emitter pillar and of the emitter contact pillar. This way, the base area can be increased and the resistance of the base-contact structure can be reduced. In these embodiments, the collector stack advantageously also covers a lateral region extending between and including at least a part of the top surfaces of the two base-contact arms. Such structures may advantageously exhibit a mirror symmetry with respect to a mirror plane that is perpendicular to the substrate surface and coincides with a central vertical plane of the emitter pillar.

However, other embodiments with two emitter-contact pillars have only one base-contact arm.

Materials suitable to form the base-contact structure include any of Ti, TiN, Ta, Ni, Al, and Cu. Other embodiments use a combination of these materials, for instance in the form of a multilayer base-contact structure, or in the form of an alloy.

Preferably, the top surface of the emitter-contact pillar is covered by an emitter-contact layer. Materials for forming the emitter-contact layer are preferably silicides of Ni, Ti and Co, such as $NiSi_{2-x}$, $TiSi_{2-x}$, and $CoSi_{2-x}$, wherein $0 \leq x < 2$.

In some embodiments, the collector stack comprises a collector layer that is made of an electrically conductive semiconductor, such as n-type silicon in the case of an graphene base n-type transistor (hot electron transistor). In other embodiments, the collector layer is made of a metallically conductive material, in particular a metal.

The collector-barrier layer is in some embodiments made of a dielectric material, such as $HfO_2$, or $Al_2O_3$, $SiO_2$, $(SiO_2)_x(TiO_2)_{1-x}$, a compositionally graded $Si_xTi_{1-x}O_2$ layer, including a $SrTiO_3$ layer at an interface between the collector barrier layer and the base layer, or comprises a $Ta_2O_5$ layer at the interface between the collector barrier layer and the collector, and a compositionally graded $Ta_xTi_yO$ layer at the interface between the collector barrier layer and the base layer.

The high-frequency characteristics of the graphene base transistor are further improved in an embodiment having a graphene base layer that covers only a part of a lateral extension of the base-contact arm (or arms). The lateral extension meant here is to be measured in a direction perpendicular to the longitudinal direction of the base-contact arm. In accordance with the present invention, the collector stack shares the lateral extension of the graphene base layer also in the present invention.

In a further embodiment, the at least one base-contact arm layer is further structured internally. Preferably, the at least one base contact arm includes at least one opening that is laterally positioned on the at least one base-contact arm and that extends through the base-contact arm in a vertical direction, which points perpendicularly to the substrate surface. The graphene base layer preferably covers the at least one opening. The openings may have different geometric shapes in different embodiments. In one embodiment, a sequence of individual slit-shaped openings is fabricated. The slits may have their longitudinal direction perpendicular to the longitudinal direction of the base contact arms. Other shapes are similarly useful, such as circular, or elliptic shapes. In preferred variants the openings are filled at least partially by the graphene and collector-stack deposition, in other variants they are left partially free, i.e., filled with a gas such as ambient air. Providing such openings in the at least one base-contact arm layer helps improving an electrical contact between the base-contact arm/arms and the graphene base layer, and thus reduces the resistance of the base-contact structure.

The opening or openings are in one process embodiment fabricated before the graphene deposition. They are in fact preferably fabricated right away at the time of fabricating the base-contact arms by suitable structuring. However, in a variant involving more processing steps, the openings may be provided later by an additional structuring step of the base contact arms. This latter process variant may for instance be used in case the at least one opening is fabricated after the graphene deposition. This case implies that the openings are also fabricated to extend through the collector stack and the graphene layer.

Further embodiments of the graphene base transistor exhibit a combination of the additional features of at least two of the embodiments or their respective variants described above.

According to a second aspect of the present invention, an electronic component comprises at least one graphene base transistor according to the first aspect of the present invention or at least one of its embodiments, and at least one other active or at least one passive electronic device, such as a bipolar transistor, field effect transistor, passive electronic device, optoelectronic device, photonic device, or MEMS device on the same substrate, in particular a silicon or silicon-on-insulator substrate. Embodiments of the electronic component include at least one MOS, BiMOS, NMOS, PMOS, CMOS, or BiCMOS circuit and at least one graphene base transistor. Other embodiments additionally include a field effect transistor having a graphene channel. The electronic component of the second aspect of the present invention may be provided in the form of a wafer, an individual chip, or a packaged electronic device including at least one such chip, e.g., a packaged system-on-chip or a system-in-package including at least two chips in one package.

According to a second aspect of the present invention, a method for fabricating a graphene base transistor comprises
  providing a silicon substrate surface;
  fabricating an electrically conductive pillar foundation on the substrate surface, at least one emitter pillar and at least one emitter-contact pillar, which extend from the pillar foundation in a vertical direction pointing away perpendicularly from the substrate surface;
  embedding emitter pillar and the emitter contact pillar in a dielectric filling layer in regions above the pillar foundation, and fabricating an upper surface of the filling layer to flush with a top surface of the emitter pillar;
  fabricating on the dielectric filling layer an electrically conductive base-contact structure, which includes
    a) a base-contact face, which is arranged at a lateral distance from the emitter pillar, and,
    b) at least one base-contact arm, which extends from the base-contact face in a direction parallel to the substrate surface and passes between the top surfaces of the emitter pillar and of the emitter contact-pillar without directly contacting them;
  covering a contiguous lateral region extending at least between and including the top surface of the emitter pillar and the at least one base-contact structure with a graphene layer;

fabricating a collector stack that comprises at least a collector-barrier layer, which is arranged immediately on the graphene layer, and an electrically conductive collector layer, which is arranged on the collector-barrier layer, wherein the collector stack and the base layer are subsequently structured together to give them the same lateral extension in a direction that is parallel to the substrate surface and perpendicular to those edges of the top surface of the emitter pillar and the base-contact arm that face each other.

The method of the third aspect of the invention shares the advantages of the graphene base transistor of the first aspect of the invention. Reference is made to the above explanation of advantages of the graphene base transistor.

Fabricating the additional features of the different embodiments of the graphene base transistor mentioned above forms respective additional features of preferred embodiments of the method of the third aspect of the present invention. In the following, additional embodiments of the method will be described.

In one embodiment, fabricating the electrically conductive pillar foundation, the at least one emitter pillar and at least one emitter-contact pillar comprises structuring an emitter layer by masked anisotropic etching to form the emitter pillar and the emitter-contact pillar, and stopping the etching before reaching the foundation mesa in order to obtain the pillar foundation.

The emitter layer may be formed by depositing an electrically conductive semiconductor layer on the substrate surface, or merely by doping a surface region of the substrate. The doping may be done before or after the structuring of the emitter layer.

One embodiment further comprises, before fabricating the collector stack, preferably even before fabricating the graphene layer, a step of fabricating a metallically conductive emitter-contact face directly on an exposed top surface of the emitter-contact pillar.

Some embodiments include a step of fabricating an emitter-barrier layer on the emitter pillar before fabricating the graphene layer.

According to a fourth aspect of the present invention, a method for fabricating an electronic component comprises a) covering a first lateral region of a silicon substrate or silicon-on-insulator substrate of with a first masking layer;

b) fabricating a graphene transistor according to a method of the third aspect of the invention or one of its embodiments a second lateral region on the silicon surface of the substrate;

c) removing the first masking layer from the first lateral region;

d) covering the second lateral region with a second masking layer e) fabricating at least one active or passive electronic device in the first lateral region on the silicon surface of the substrate;

f) removing any remaining masking layer.

In this method, the sequence of steps d) to f) is performed either before or after the sequence of steps a) to c). That is, the fabrication of the graphene base transistor according to the third aspect of the invention or one of its embodiments is inserted as an additional process module to a known fabrication process for an active or passive device. This process module may be inserted before or after the known fabrication process of the of the active or passive device. This process may for instance be a standard MOS-process. Other process examples have been mentioned above.

Additional embodiments are presented by the enclosed claims.

BRIEF DESCRIPTION OF THE DRAWINGS

In the following, further embodiments will be explained with reference to the enclosed drawings.

DETAILED DESCRIPTION

Figure 1:
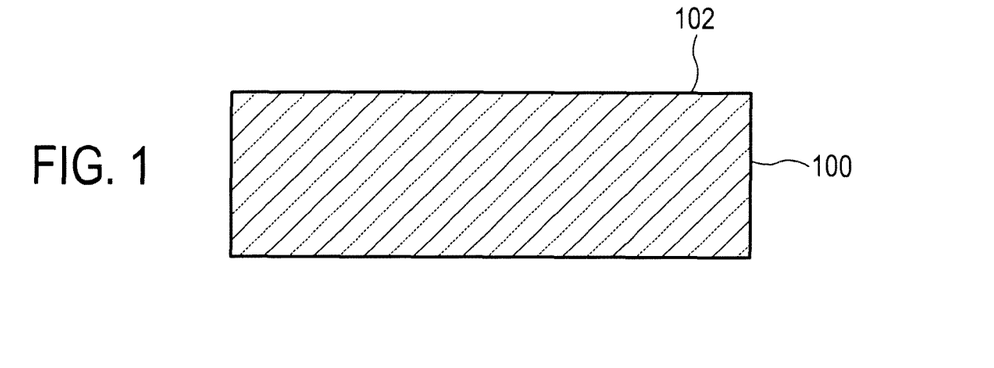
FIG. 1 shows a cross sectional view of a lateral section of a semiconductor wafer representing a first stage of an embodiment of a method for fabricating a graphene base transistor.

FIG. 1 shows a cross-sectional view of a lateral section of a semiconductor wafer 100 representing a first stage of an embodiment of a method for fabricating a graphene base transistor. The wafer 100 is in different preferred embodiments a silicon wafer or a silicon-on-insulator (SOI) wafer. For the purpose of better readability of the present description, it shall be assumed, without intending to reduce the scope of the present invention, that the wafer 100 is a silicon wafer. For the alternative embodiment of a SOI wafer, the same processing steps as described hereinafter have to be applied, thus resulting in a processing of the upper silicon layer corresponding to that described for the silicon wafer 100 in the following.

The wafer 100 may be doped. For instance, for an n-type (hot electron) transistor the substrate may be n-doped. The following description will focus on an embodiment of fabricating an n-type transistor, without any intention to restrict the scope of the present invention.

The wafer 100 has a surface 102, which herein is also referred to as a substrate surface and which is used for processing the wafer 100 in the subsequent fabrication steps.

Figure 2:
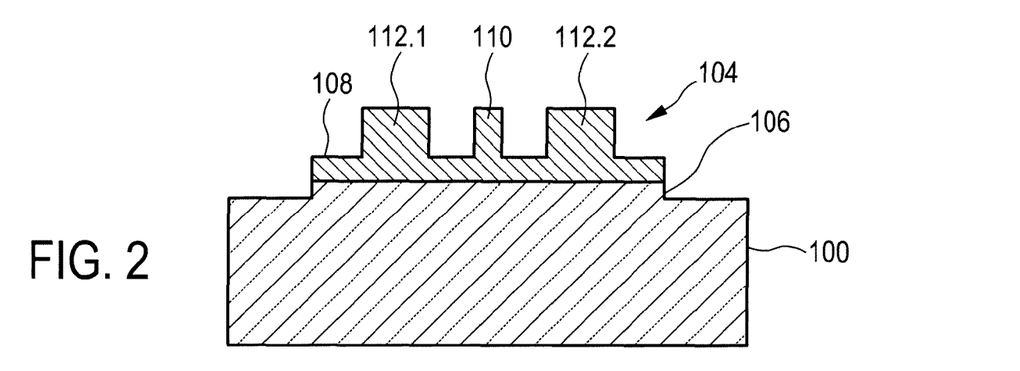
FIG. 2 shows a cross sectional view of the same lateral section of the processed semiconductor wafer representing a second stage of an embodiment of the method for fabricating a graphene base transistor.

FIG. 2 shows a cross sectional view of the same lateral section of the semiconductor wafer 100, representing a second stage of the present method embodiment for fabricating a graphene base transistor.

On the substrate wafer 100, an n-type emitter layer 104 has been deposited and structured. The emitter layer is for instance made of n-type silicon. The emitter layer may originally cover the full wafer. In this case, the structuring of the emitter layer 104 involves a first masked etching step of the emitter layer 104 to an island shape on the substrate surface 102, separated from other emitter islands (not shown). During this process of structuring the emitter layer 104 to an island shape, a mesa 106 of silicon wafer material may be formed on the substrate surface 102. This mesa appears as a base of wafer material for the emitter layer 104 in FIG. 2. However, forming the mesa 106 is not a requirement and may be avoided completely by accordingly controlling the etching process. Alternative methods than the one just described may be employed for forming the island-shape of the emitter layer 104. For instance, the emitter island may be etched into the silicon of the wafer 100 without prior deposition. In yet a further variant, the island shaped emitter layer 104 results from a masked deposition step.

FIG. 2 also shows that the emitter layer 104 is further structured to exhibit a pillar foundation 108, an emitter pillar 110 and two emitter-contact pillars 112.1 and 112.2. The emitter pillar 110 and the emitter-contact pillars 112.1 and 112.2 extend vertically from the pillar foundation 108, through which they are electrically connected. In other words, they extend in a vertical direction pointing away from the substrate surface 102. This structuring of the emitter layer 104 can be obtained in a masked anisotropic etching process.

Figure 3:
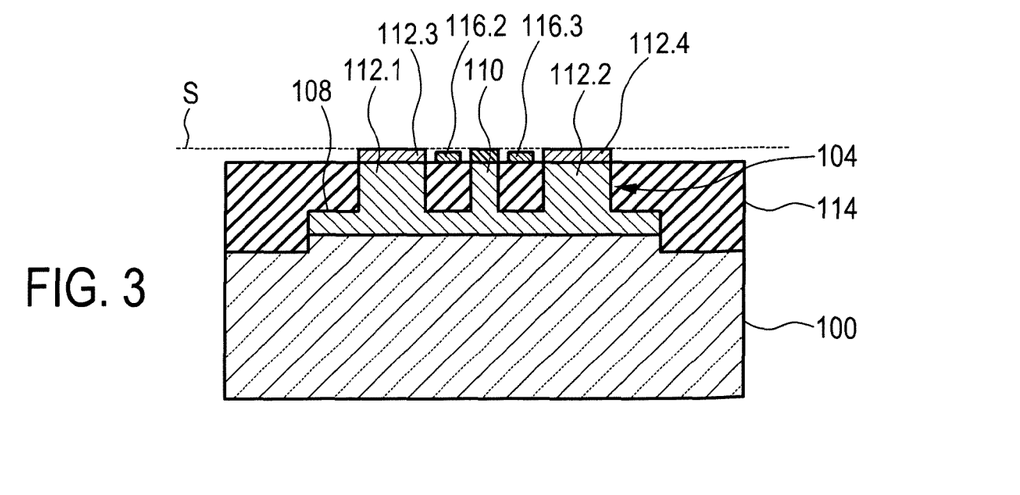
FIG. 3 shows a cross sectional view of the same lateral section of the processed semiconductor wafer representing a third stage of an embodiment of the method for fabricating a graphene base transistor.
Figure 4:
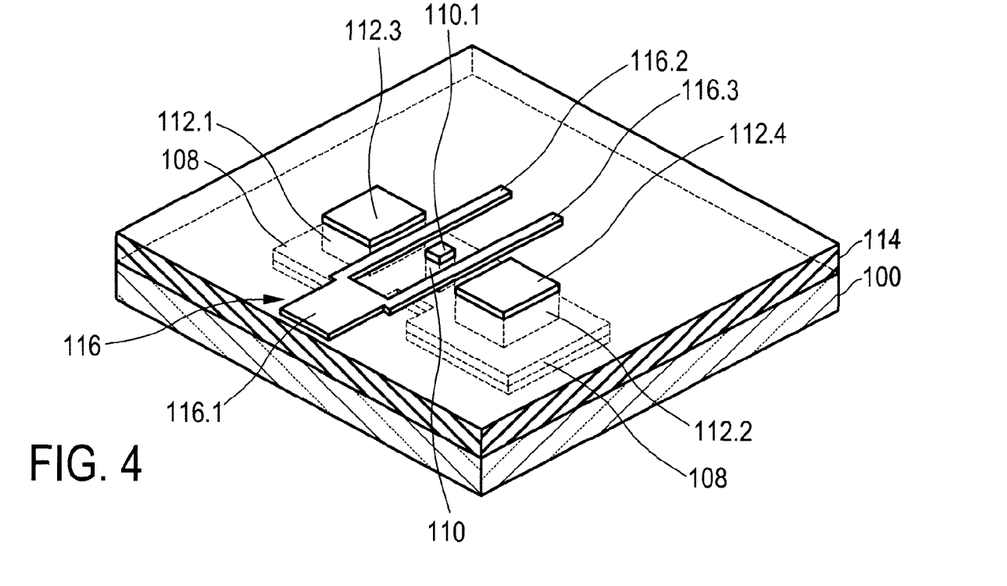
FIG. 4 shows a perspective view of a similar lateral section of the processed semiconductor wafer as FIG. 3, representing the third stage of an embodiment of the method for fabricating a graphene base transistor.

FIG. 3 shows a cross-sectional view of the same lateral section of the processed semi-conductor wafer 100, representing a third stage of the method embodiment for fabricating a graphene base transistor. FIG. 4 shows a perspective view of a similar lateral section of the processed semiconductor wafer as FIG. 3, also representing the third processing stage. The following description refers to FIGS. 3 and 4 in parallel.

In this third processing stage, the emitter layer 104 has been embedded in a dielectric filling layer 114. The dielectric filling layer 114 laterally embeds the emitter pillar 110 and the emitter-contact pillars 112.1 and 112.2, and separates them from each other in regions above the pillar foundation 108. In particular, the dielectric filling layer 114 fills the space that extends above the pillar foundation 108 and laterally between the emitter pillar 110 and the emitter-contact pillars 112.1 and 112.2. It also extends laterally around the island-shaped emitter layer 104 to isolate the graphene base transistor from neighboring devices. The dielectric filling layer is for instance made of silicon dioxide. It is deposited by deposition methods known per se in the art.

Furthermore, emitter contact-layers 112.3 and 112.4, an emitter-barrier layer 110.1, and a base contact-structure 116 have been deposited, which will be described in more detail in the following paragraphs.

The emitter contact-layers 112.3 and 112.4 form a top surface of the emitter-contact pillars 112.1 and 112.3, respectively. They are made of a silicide of Ni, Ti or Co, such as $NiSi_{2-x}$, $TiSi_{2-x}$, and $CoSi_{2-x}$, wherein $0 \leq x < 2$. The emitter barrier layer 110.1 forms a top surface of the emitter pillar 110. It can be formed from $SiO_2$ for example.

The base-contact structure 116 is in the present embodiment arranged on the dielectric filling layer 114. As is best seen in FIG. 4, the base-contact structure 116 includes a base-contact face 116.1 and two base-contact arms 116.2 and 116.3. The base-contact face 116.1 is arranged at a lateral distance from the emitter pillar 110 in a direction perpendicular to the cross-sectional plane displayed in FIG. 3. The base-contact face 116.1 of the present embodiment has a square shape. It serves for providing an electrical contact face for contact vias (not shown), for connecting the graphene base of the transistor to an electrical trace (not shown) and potentially on to other elements of an electronic circuit (not shown) in later processing stages.

The base-contact structure 116 further comprises two base-contact arms 116.2 and 116.3, which extend from the base-contact face in a direction parallel to the substrate surface, which corresponds to the mentioned distance direction perpendicular to the cross-sectional plane displayed in FIG. 3. In comparing these lateral directions, no distinction is made between directions which are at 180° angles to each other. As such, the base-contact arms 116.2 and 116.2 pass between the top surfaces of the emitter pillar 110 and of the emitter contact-pillars 112.1 and 112.2, without directly contacting them.

The base-contact structure 116 is made from a metal. Preferred metals are Ti, TiN, Ta, Ni, Al, or Cu.

A dashed line S is shown in FIG. 3 to indicate that at least the emitter barrier layer 110.1, the emitter contact-layers 112.3 and 112.4 and the base-contact arms 116.2 and 116.3 have their surfaces in a common surface plane S that extends perpendicularly to the cross sectional plane displayed in FIG. 3, to a degree achievable by known planarization techniques, such as chemical-mechanical planarization (CMP).

In the present context, the emitter-contact layers 112.3 and 112.4 are considered to form a part of the emitter-contact pillars 112.1 and 112.2, and the emitter-barrier layer 110.1 is considered to form a part of the emitter pillar 110. FIG. 3 displays the emitter-barrier layer 110.1, the emitter contact-layers 112.3 and 112.4 and the base-contact arms 116.2 and 116.3 as if they were protruding clearly from a surface of the dielectric filling layer 114. However, this graphical representation is not to scale and is chosen here for reasons of better visibility only. In fact, the mentioned layers hardly protrude from the surface of the dielectric filling layer 114 at all, meaning that either they are embedded in the dielectric filling layer 114, with only their top surfaces exposed, or that they protrude by at most about 10 nanometer from the surface of the dielectric filling layer 114. CMP allows including the also surface of the dielectric filling layer 114 in the common surface plane S.

For the purpose of the following deposition of a graphene layer it is in some embodiments advantageous to provide minor surface steps at the edges between the dielectric filling layer 114 and the emitter pillar 110, and between the dielectric filling layer 114 and the base-contact arms 116.2 and 116.3. Such minor surface steps in the range of 10 nanometer are advantageous as seed sites for the graphene base layer in particular if graphene is deposited by a vapor phase technique, such as chemical vapor deposition (CVD).

Figure 4A:
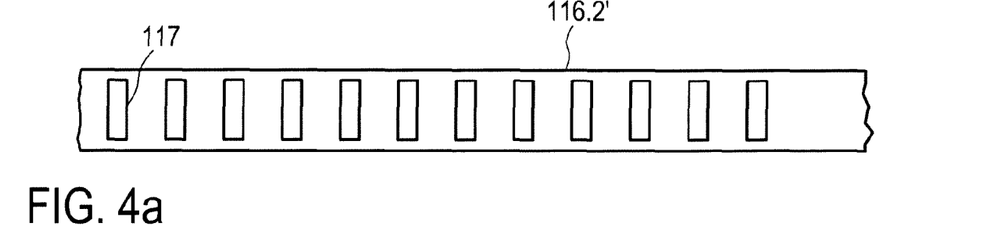
FIG. 4a shows a schematic top view of a section of a base-contact arm according to an advantageous variant of the structure shown in FIG. 4.

FIG. 4a shows a schematic top view of a section of a base-contact arm according to an advantageous variant of the structure shown in FIG. 4. FIG. 4a thus only shows a section containing only a base-contact arm 116.2' of the base-contact structure 116. Of course, the same alternative structure shown in FIG. 4a can also be used for the other base-contact arm 116.2 of the base contact structure. Preferably it is used for both contact arms. The base-contact arm 116.2' differs from the base-contact arm 116.2 of FIG. 4 in that is contains additional structuring in the form of openings, one of which is marked in FIG. 4a by the reference label 117. The openings are laterally positioned and disposed on the base-contact arm 116.2'. They extends through the base-contact arm in a vertical direction, which points perpendicularly to the paper plane of FIG. 4, i.e., perpendicularly to the substrate surface 102 (see FIG. 1). Providing such openings in the at least one base-contact arm layer helps improving an electrical contact between the base-contact arm/arms and the graphene base layer, and thus reduces the resistance of the base-contact structure. The shape of the openings is a slit shape in the present example. It is a circular shape, a square shape, or an oval shape in alternative variants.

Figure 5:
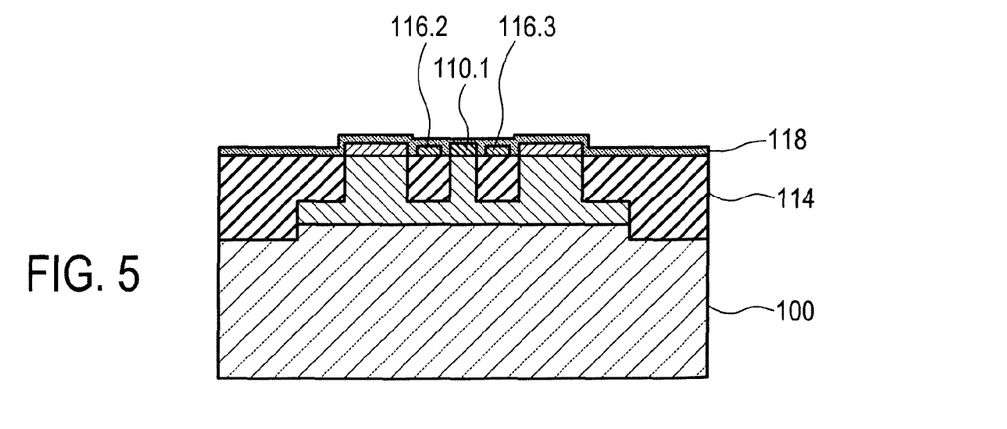
FIG. 5 shows a cross sectional view of the same lateral section of the processed semiconductor wafer as shown in FIGS. 1 to 3, representing a fourth stage of an embodiment of the method for fabricating a graphene base transistor.

FIG. 5 shows a cross sectional view of the same lateral section of the processed semiconductor wafer 100 as shown in FIGS. 1 to 3, representing a fourth stage of an embodiment of the method for fabricating the graphene base transistor.

In the fourth processing stage shown, a graphene layer 118 has been deposited. In the present embodiment, the graphene layer 118 has been deposited on the surface S (cf. FIG. 3) by CVD. However, other process embodiments use other deposition techniques for the graphene layer 118, such as exfoliation, bonding, or transfer. The graphene layer has been deposited as a layer that is contiguous and extends between and covers the top surface of the emitter pillar 110, i.e., including the emitter-barrier layer 110.1, and the top surfaces of the base-contact arms 116.2 and 116.2. In a vertical direction, the graphene layer 118 is immediately adjacent to the mentioned top surfaces.

Depending on the nature of the deposition technique, the graphene layer 118 may cover the whole surface provided for growth. In any case, irrespective of the chosen deposition technique, the graphene layer at this processing stage extends over more than the lateral region desired for the formation of the graphene base layer. Thus, further structuring of the graphene layer 118 is required to form a base layer of the graphene base transistor. This will be described in the following with reference to FIGS. 6 and 7.

Figure 6:
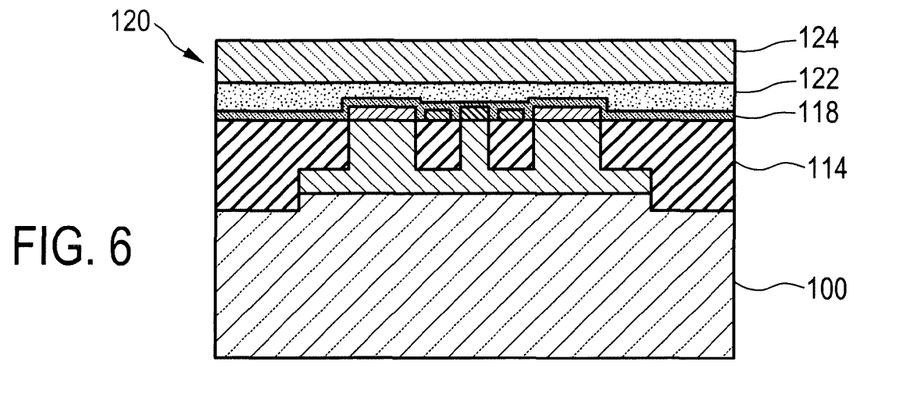
FIG. 6 shows a cross sectional view of the same lateral section of the processed semiconductor wafer, representing a fifth stage of an embodiment of the method for fabricating a graphene base transistor.

FIG. 6 shows a cross-sectional view of the same lateral section of the processed semiconductor wafer 100 as FIG. 5, representing a fifth stage of an embodiment of the method for fabricating a graphene base transistor.

In this fifth processing stage, a collector stack 120 has been deposited that extends of the whole surface of the wafer. In particular, the collector stack covers the graphene layer 118. The collector stack 120 is formed by a collector-barrier layer 122, which is a dielectric layer, preferably a high-k dielectric layer such as, for example, $HfO_2$ or $Al_2O_3$ On the collector-barrier layer 122, a collector layer 124 is deposited.

The collector layer 124 may be made from a doped semiconductor, such as n-type Si, or from a metal. In the present example, the collector layer 124 is a metal. This reduces the processing complexity for forming contacts, as no separate deposition of a metal for forming a contact face is required. Suitable metals are for instance Ti, TiN, Ta, Ni, Al or Cu, W, or silicides Ti, Ta, Ni, Al or Cu, or W, or a combination of at least two of these materials. The selection of the metal most suitable of a given transistor design is made with a view to the work function of the metal in accordance with the design requirements in view of a desired working point of the transistor in operation.

Figure 7:
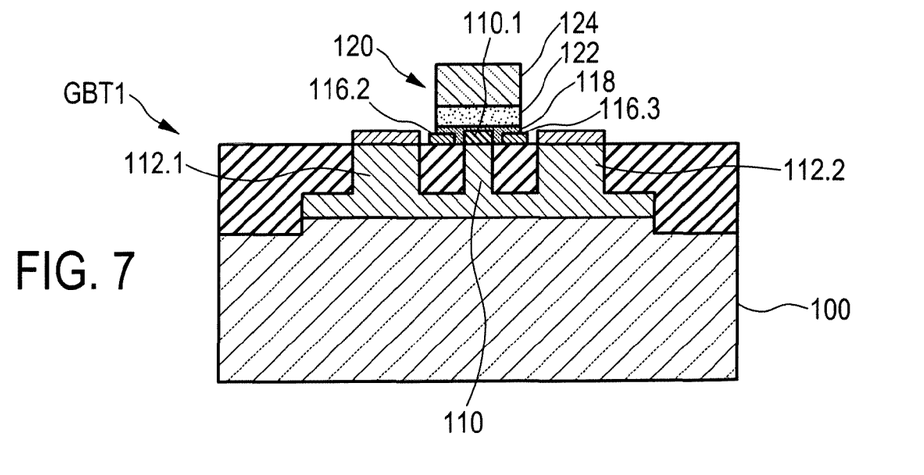
FIG. 7 shows a cross sectional view of the same lateral section of the processed semiconductor wafer, representing a sixth stage of an embodiment of the method for fabricating a graphene base transistor, and at the same time forming an embodiment of a graphene base transistor.
Figure 8:
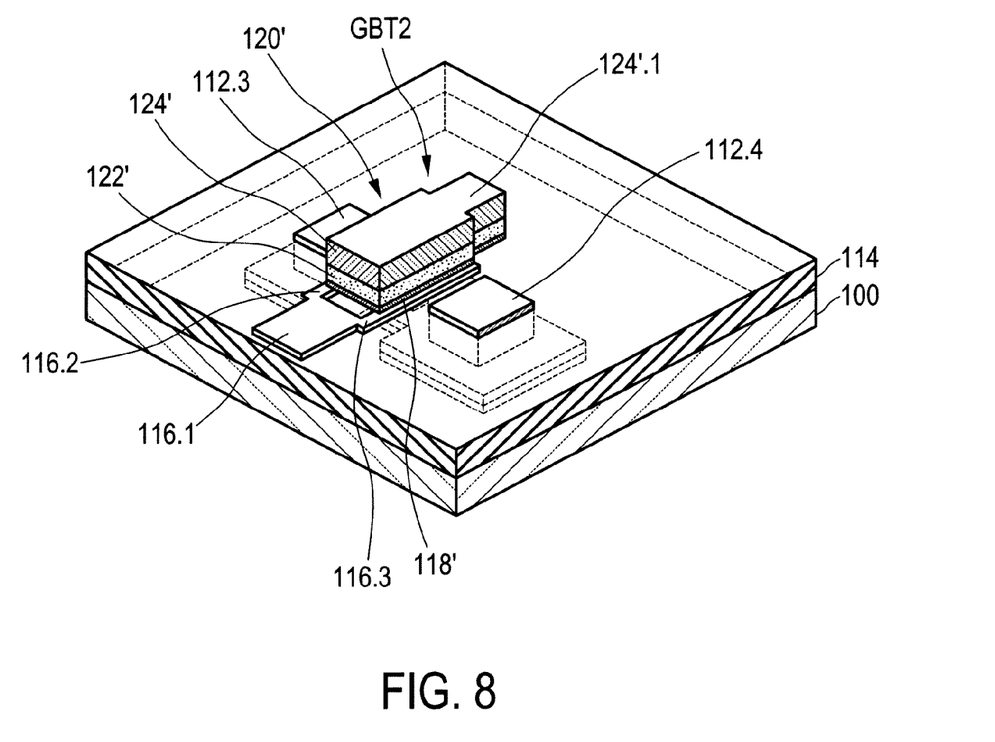
FIG. 8 shows a perspective view of a similar lateral section of the processed semiconductor wafer as FIG. 6, representing a variant of the sixth stage of an embodiment of the method for fabricating a graphene base transistor, and at the same time forming an embodiment of a graphene base transistor.

FIG. 7 shows a cross-sectional view of the same lateral section of the processed semiconductor wafer 100 as FIG. 6, representing a sixth stage of an embodiment of the method for fabricating a graphene base transistor. FIG. 8 shows a perspective view of a similar lateral section of the processed semi-conductor wafer as FIG. 6, representing a variant of the sixth stage of an embodiment of the method for fabricating a graphene base transistor. Even though the variants of FIG. 7 and FIG. 8 are slightly different from each other, as will be explained further below, FIG. 8 is also used to represent a perspective view of the transistor at the processing stage shown in FIG. 7. However, to distinguish the variants, reference labels 118', 120', 122' and 124' are used in FIG. 8 for the structural elements bearing the reference labels 118, 120, 122 and 124, respectively, in FIG. 7. In the following, FIGS. 7 and 8 will be referred to in parallel.

In this sixth processing stage, the collector stack 120, 120' and the graphene layer 118, 118' have been structured to together form a collector and base structure of the transistor. In other words, the graphene layer and the collector stack have been subjected to a masked etching process that has removed the collector stack 120, 120' and the graphene layer 118, 118' outside the lateral region desired for fabricating the graphene base transistor. To this end, a two-step anisotropic etching process may be employed, using for instance reactive ion etching (RIE). In one possible process, only the collector layer is etched in a first etching step, and subsequently the collector barrier layer and the graphene base layer are etched together in a second etching step. Metal collector layers can for instance be etched in the first etching step by RIE using chlorine chemistry. Graphene and the collector barrier layer can be etched together for many suitable collector-barrier materials (including, among others $HfO_x$) using BCl and CFx chemistry.

In particular, as FIGS. 7 and 8 show, the collector stack 120, 120' and the graphene layer 118, 118' have been removed from regions longitudinally extending beyond the base-contact arms 116.2 and 116.3, thus exposing the emitter-contact layers 112.3 and 112.4. The mentioned minor difference between the variants of FIGS. 7 and 8 lies in a slightly different lateral extension of the collector stack 120 and the base layer 118 in the variant of FIG. 7 in comparison with the collector stack 120' and the base layer 118' in the variant of FIG. 8. In the variant of FIG. 7, the collector stack 120 and the base layer 118 have also been removed from a part of the lateral extension of the base-contact arms 116.2 and 116.3 in the lateral direction perpendicular to those edges of the top surface of the emitter pillar 110 and the base-contact arms 116.2 and 116.3 that face each other in the shown cross-sectional plane of FIG. 7. This has exposed parts of the base-contact arms 116.2 and 116.3 on surface sides oriented towards the emitter contact pillars 112.1 and 112.2, respectively. In contrast, the graphene layer 118' and the collector stack 120' of the variant of FIG. 8 cover the whole extension of the base-contact arms 116.2 and 116.3 in the lateral direction under consideration. This variation of lateral coverage gives an additional degree of freedom to independently optimize the collector-stack-to-emitter parasitic capacitance and the base resistance. The examples of FIG. 7 and FIG. 8 show different variants of such optimization options. In particular, the variant of FIG. 7 has a lower base resistance than the variant of FIG. 8, which is achieved by creating an edge of the structured graphene on the base-contact arm.

In both variants, the collector stack 120, 120' and the base layer 118, 118' extend from near the base-contact face 116.1 along the longitudinal direction of the base-contact arms 116.2 and 116.3 up to their longitudinal end to form a collector-contact face 124'.1 (not visible in the cross-sectional view of the variant of FIG. 7).

It is noted that in one embodiment (not shown) the collector stack and the graphene layer are structured to extend beyond the base-contact arms in their longitudinal direction. The longitudinal overlay of the collector stack and the graphene layer over the base contact layers can thus be adapted to optimize the collector-stack to emitter parasitic capacitance, depending on a desired base resistance.

The base resistance can be reduced by increasing the length of graphene edge that is in contact with the base-contact layer. This can be achieved by etching the collector stack in appropriate shapes.

This completes the description of the front-end-of-line processing and of the construction of two variants of a graphene base transistor GBT1, GBT2, which are shown in FIGS. 7 and 8. Further process steps required involve a back-end-of-line processing the fabrication of interconnect structures such as vias, interconnect lines and dielectric layers, as is well known.

As described, the collector stack 124, which is deposited over the graphene layer 118, not only forms a functional layer structure of the graphene base transistor, but at the same time protects the graphene layer 118 during a required structuring that limits the lateral extension of an originally deposited graphene layer 118 to the desired extension of the base layer. For this reason, in accordance with the present invention, the collector stack and the base layer have a common lateral extension in lateral directions in the embodiments shown.

Figure 9:
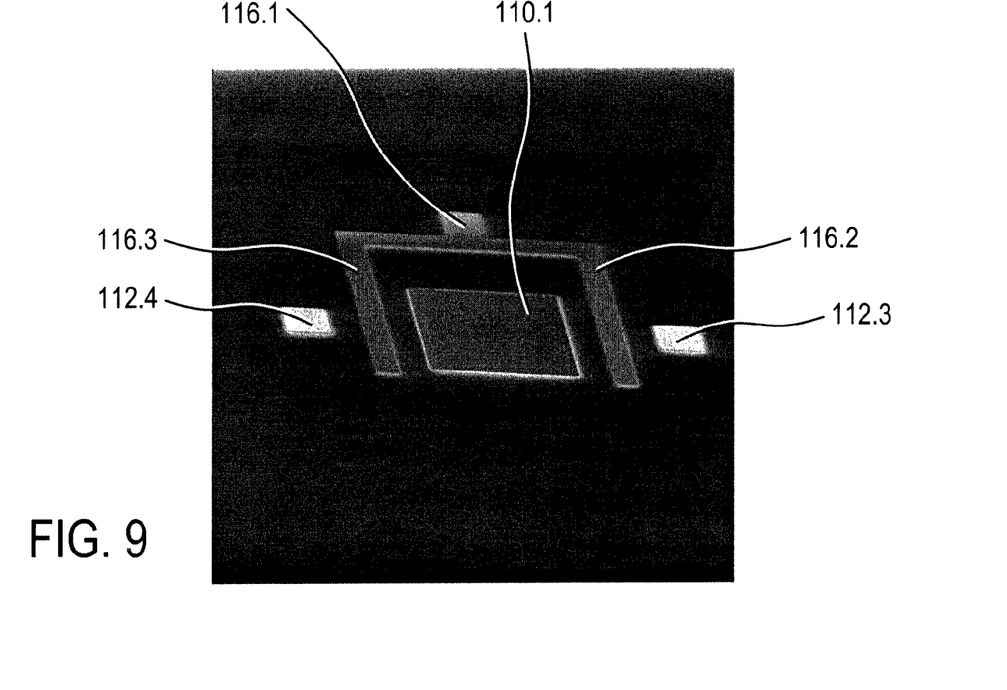
FIG. 9 shows a scanning electron micrograph of a perspective view of another processed semiconductor wafer, representing a stage of a second embodiment of the method for fabricating a graphene base transistor that is similar to the processing stage shown in FIG. 4.

FIG. 9 shows a scanning electron micrograph of a perspective view of another processed semiconductor wafer, representing a stage of a second embodiment of the method for fabricating a graphene base transistor that is similar to the processing stage shown in FIG. 4. A length scale shown at the bottom right covers a length of 10 micrometers. The same reference labels are used as in FIG. 4 to point to corresponding structural elements. In the processing stage, the emitter contact structure comprising the emitter pillar 110 (not visible) covered by the emitter barrier layer 110.1 and the emitter-contact pillars 112.1, 122.2 (not visible) covered by the emitter-contact layers 112.3 and 112.4 have been prepared. The base-contact structure including the base-contact face 116.1 and the base-contacts arms 116.2 and 116.3 is fully visible. A graphene layer has not been deposited at this processing stage.

Figure 10:
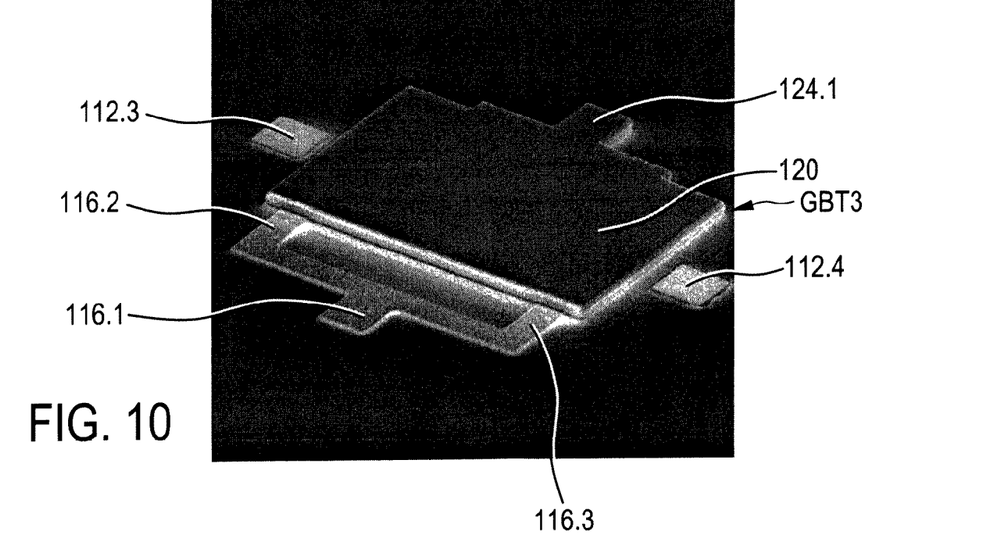
FIG. 10 shows a scanning electron micrograph of a perspective view of the processed semiconductor wafer of FIG. 9, representing a stage of a second embodiment of the method for fabricating a graphene base transistor that is similar to the processing stage shown in FIG. 8, and forming another embodiment of a graphene base transistor.

FIG. 10 shows another scanning electron micrograph of a perspective view of the processed semiconductor wafer of FIG. 9, representing a stage of a second embodiment of the method for fabricating a graphene base transistor that is similar to the processing stage shown in FIG. 8, and forming another embodiment of a graphene base transistor GBT3. A length scale shown at the bottom right covers a length of 10 micrometers.

The micrograph of FIG. 10 shows the graphene base transistor GBT3 from a different angle than FIG. 9. In comparison to the earlier processing stage shown in FIG. 9, the graphene base layer (not visible) and the collector stack 124 have been deposited and structured. In this embodiment, the graphene base layer and the collector stack 124 even extend slightly beyond the base-contact arms 116.2 and 116.3 towards the emitter-contact layers 112.3 and 112.4.

Scaling of the transistor structure of FIG. 10 to smaller lateral extensions is of course possible.

Figure 11:
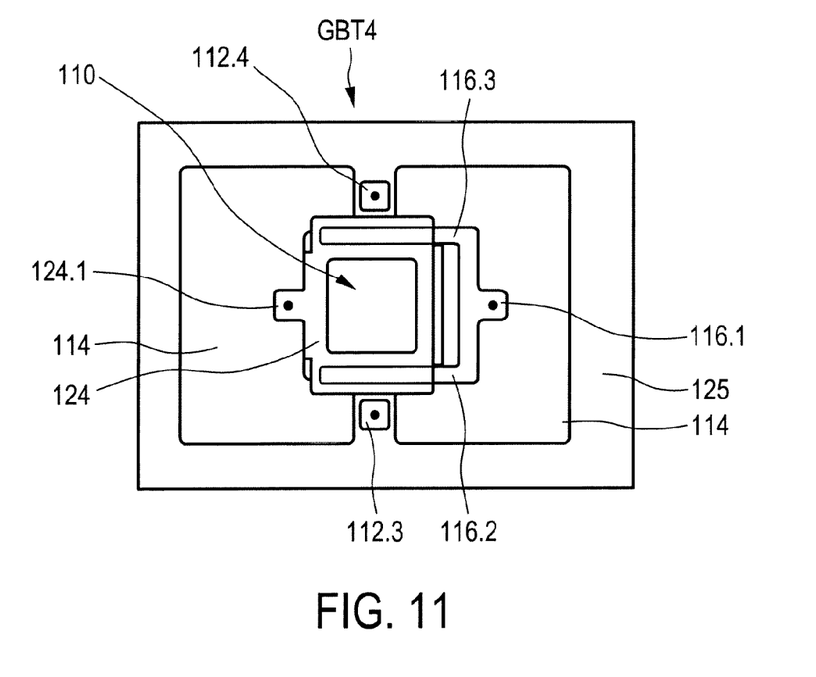
FIG. 11 shows a top view of another embodiment of a graphene base transistor.

FIG. 11 shows a top view of another embodiment GBT4 of a graphene base transistor. The top view shows the central position of the emitter pillar 110, which actually lies underneath the collector layer 124 of collector stack and is made visible graphically. Other features shown correspond to the micrograph of FIG. 10 and bear identical reference labels in comparison with corresponding structural elements of the graphene base transistor GBT3 of FIG. 10. The graphene base transistor GBT4 of FIG. 11 has an additional conducting layer 125 laterally surrounding the active transistor layers. This conducting layer 125 can be used as a HF-ground for connecting lines (not shown). This option may however be very useful for mixed signal chips, where cross-talk between different subcircuits can be avoided by using multiple grounds or very well controlled ground paths. For some other applications, on the other hand, no immediate ground reference is needed. In this case, the conduction layer 125 is not required and is preferably not present.

Figure 12:
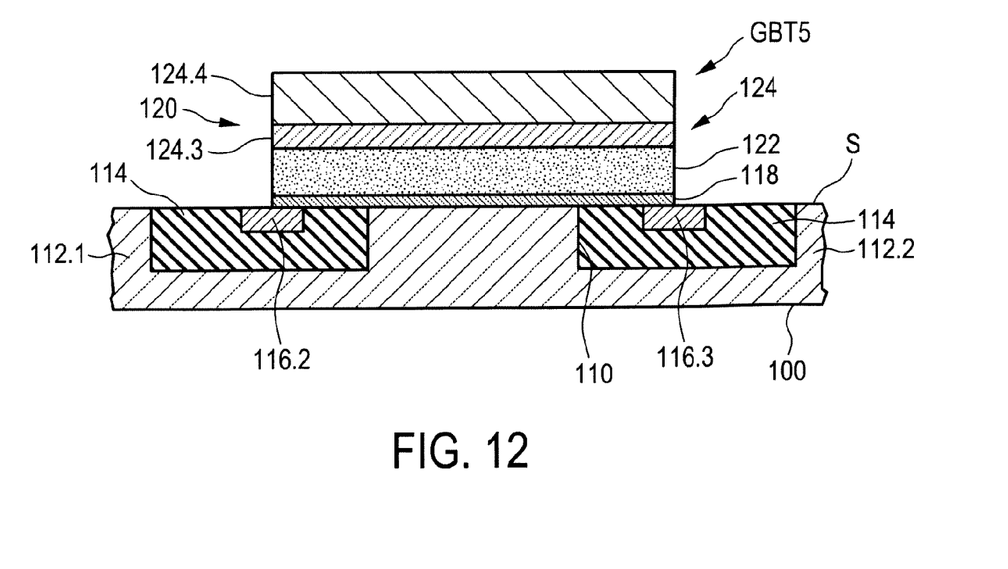
FIG. 12 shows a cross-sectional view of a further embodiment of a graphene base transistor.

FIG. 12 shows a cross-sectional view of a further embodiment of a graphene base transistor GBT5. The section shown is laterally more limited so that the emitter-contact pillars 112.1 and 112.2 are not fully shown. The view is also more schematic in that some structural elements such as emitter-contact layers are not shown. The following description focuses on differences in comparison with the previous embodiments.

The present embodiment of a graphene base transistor GBT5 has a base-contact structure that is embedded into the dielectric filling layer 114, thus only exposing top surfaces of the base-contact arms 116.2 and 116.3 in a common surface plane S, on which the graphene layer 118 is grown. In comparison with the embodiments of FIGS. 7 and 8, embedding the graphene-contact structure requires more processing effort, but allows making the base contact structure thicker and thus able to carry higher base currents, as may be desired for specific application purposes. The collector stack in the present embodiment has a $HfO_2$ layer 122, followed by a collector layer 124 that has a bilayer structure formed by a Ti layer 124.3 and a TiN layer 124.4. The thickness of the collector barrier is for instance 50 nm. The thickness of the Ti layer is for instance 15 nm, and the thickness of the TiN layer is for instance 50 nm.

The transistor structures shown may be incorporated into a single semiconductor wafer together with any type of circuit element, thus enabling full integration of graphene base transistors into known semiconductor processing technologies.

The invention claimed is:

1. A graphene base transistor, comprising, on a semiconductor substrate surface:
   at least one emitter pillar and at least one emitter-contact pillar, which extend from a pillar foundation, through which they are electrically connected, in a vertical direction pointing perpendicularly away from the substrate surface;
- a dielectric filling layer laterally embedding the emitter pillar and the emitter-contact pillar, and separating them from each other in regions above the pillar foundation,
- an electrically conductive base-contact structure, which is either arranged on or embedded in the dielectric filling layer and which includes
  a) a base-contact face, which is arranged at a lateral distance from the emitter pillar, and,
  b) at least one base contact arm, which extends from the base-contact face in a direction parallel to the substrate surface and passes between the top surfaces of the emitter pillar and of the emitter contact-pillar without directly contacting them;
- wherein the dielectric filling layer has an upper surface that is flush with a top surface of the emitter pillar and with the at least one base-contact arm
- a base layer of graphene forming a contiguous layer that extends between and covers an immediately adjacent top surface of the emitter pillar and at least a part of an immediately adjacent top surface of the at least one base-contact arm;
- a collector stack that comprises at least a collector-barrier layer, which is arranged immediately on the graphene layer, and an electrically conductive collector layer, which is arranged on the collector-barrier layer,
- wherein the collector stack and the base layer have the same lateral extension in a direction that is parallel to the substrate surface and perpendicular to those edges of the top surface of the emitter pillar and the base-contact arm that face each other.

2. The graphene base transistor of claim 1, wherein the top surface of the emitter pillar is formed by an emitter-barrier layer that is made of a dielectric material while the rest of the emitter pillar is made of a semiconductor.

3. The graphene base transistor of claim 1, wherein the emitter pillar has the shape of a rectangular parallelepiped or of a truncated cone.

4. The graphene base transistor of claim 1, comprising two emitter-contact pillars arranged on opposite lateral sides of the emitter pillar.

5. The graphene base transistor of claim 4, wherein the base-contact structure has two base-contact arms that extend in parallel to each other from the base-contact face on opposite sides of the emitter pillar and that pass between respective edges of the top face of the emitter pillar and of the emitter contact pillar.

6. The graphene base transistor of claim 5, wherein the collector stack covers a lateral region extending between and including at least a part of the base-contact arms.

7. The graphene base transistor of claim 1, wherein the base-contact structure is made of either Ti, TiN, Ta, Ni, Al or Cu or a combination of at least two of these materials.

8. The graphene base transistor of claim 1, wherein the graphene base layer covers only a part of a lateral extension of the at least one base-contact arm, wherein the lateral extension is measured in a direction perpendicular to the longitudinal direction of the base-contact arm.

9. The graphene base transistor of claim 1, wherein the at least one base contact arm includes at least one opening that is laterally positioned on the at least one base-contact arm and that extends through the base-contact arm in a vertical direction, which points perpendicular to the substrate surface, and wherein the graphene base layer covers the at least one opening.

10. An electronic component, comprising at least one graphene base transistor according to claim 1 and at least one MOS-transistor, a passive electronic device, an optoelectronic device, a photonic device, or a MEMS device on the same silicon or silicon-on-insulator substrate.

11. A method for fabricating a graphene base transistor, comprising
- providing a silicon substrate surface;
- fabricating an electrically conductive pillar foundation on the substrate surface, at least one emitter pillar and at least one emitter-contact pillar, which extend from the pillar foundation in a vertical direction pointing away from the substrate surface;
- embedding emitter pillar and the emitter contact pillar in a dielectric filling layer in regions above the pillar foundation, and fabricating an upper surface of the filling layer as flush with a top surface of the emitter pillar;
- fabricating on the dielectric filling layer an electrically conductive base-contact structure, which includes
  a) a base-contact face, which is arranged at a lateral distance from the emitter pillar, and,
  b) at least one base-contact arm, which extends from the base-contact face in a direction parallel to the substrate surface and passes between the top surfaces of the emitter pillar and of the emitter contact-pillar without directly contacting them;
- covering a contiguous lateral region extending at least between and including the top surface of the emitter pillar and the at least one base-contact structure with a graphene layer;
- fabricating a collector stack that comprises at least a collector-barrier layer, which is arranged immediately on the graphene layer, and an electrically conductive collector layer, which is arranged on the collector-barrier layer,
- wherein the collector stack and the base layer are subsequently structured together to give them the same lateral extension in a direction that is parallel to the substrate surface and perpendicular to those edges of the top surface of the emitter pillar and the base-contact arm that face each other.

12. The method of claim 11, wherein fabricating the electrically conductive pillar foundation, the at least one emitter pillar and at least one emitter-contact pillar comprises
- structuring the emitter layer by masked anisotropic etching to form the emitter pillar and the emitter-contact pillar, and stopping the etching before reaching the foundation mesa in order to obtain the pillar foundation.

13. The method of claim 12, wherein fabricating the emitter contact pillar comprises, before fabricating the collector stack, fabricating a metallically conductive emitter-contact face on the exposed top surface of emitter layer at the position of the emitter-contact pillar.

14. The method of claim 13,
- wherein fabricating the base-contact structure comprises fabricating at least one opening in the at least one base-contact arm that is laterally positioned on the at least one base-contact arm and that extends through the base-contact arm in a vertical direction, which points perpendicular to the substrate surface.

15. A method for fabricating an electronic component, comprising
   a) covering a first lateral region of a silicon substrate or silicon-on-insulator substrate of with a first masking layer;
   b) fabricating a graphene transistor according to a method of claim 11 in a second lateral region on the silicon surface of the substrate;
   c) removing the first masking layer from the first lateral region;
   d) covering the second lateral region with a second masking layer
   e) fabricating at least one other active or passive device in the first lateral region on the silicon surface of the substrate;
   f) removing any remaining masking layer
wherein the sequence of steps d) to f) is performed either before or after the sequence of steps a) to c).

16. The method of claim 11, wherein fabricating the emitter contact pillar comprises, before fabricating the collector stack, fabricating a metallically conductive emitter-contact face on the exposed top surface of emitter layer at the position of the emitter-contact pillar.

17. The method of claim 11, wherein fabricating the base-contact structure comprises fabricating at least one opening in the at least one base-contact arm that is laterally positioned on the at least one base-contact arm and that extends through the base-contact arm in a vertical direction, which points perpendicular to the substrate surface.

\* \* \* \* \*